(12) United States Patent
Colby et al.

(10) Patent No.: US 7,680,234 B2
(45) Date of Patent: Mar. 16, 2010

(54) METHOD AND APPARATUS FOR SIGNAL PHASE LOCKING

(75) Inventors: Roy Stephen Colby, Raleigh, NC (US);
Mark John Kocher, Raleigh, NC (US);
Gerald Benjamin Carson, Raleigh, NC (US)

(73) Assignee: Schneider Electric USA, Inc., Palatine, IL (US)

( * ) Notice: Subject to any disclaimer, the term of this patent is extended or adjusted under 35 U.S.C. 154(b) by 1757 days.

(21) Appl. No.: 10/785,837

(22) Filed: Feb. 24, 2004

(65) Prior Publication Data

US 2005/0187752 A1  Aug. 25, 2005

(51) Int. Cl.
*H03D 3/24* (2006.01)

(52) U.S. Cl. ............... 375/376; 375/215; 375/294; 375/373; 375/375

(58) Field of Classification Search .......... 375/376, 375/215, 294, 373, 375; 327/7, 12, 156
See application file for complete search history.

(56) References Cited

U.S. PATENT DOCUMENTS

| | | | | | |
|---|---|---|---|---|---|
| 5,134,397 | A | * | 7/1992 | Eyerly et al. | 341/116 |
| 5,304,957 | A | * | 4/1994 | Edwards | 331/12 |
| 5,963,058 | A | * | 10/1999 | Thomas | 327/3 |
| 6,034,554 | A | * | 3/2000 | Francis et al. | 327/7 |
| 6,259,755 | B1 | * | 7/2001 | O'Sullivan et al. | 375/376 |
| 2002/0116667 | A1 | * | 8/2002 | McEwen et al. | 714/39 |

* cited by examiner

*Primary Examiner*—Shuwang Liu
*Assistant Examiner*—Kabir A Timory

(57) ABSTRACT

A phase locked loop (PLL) circuit provides ac devices, such as power inverters and power measurement devices, with a reliable means for synchronizing to ac electrical systems. In an exemplary embodiment, the PLL circuit is configured for operation with single-phase electrical systems and offers substantial noise immunity by basing its locking operations on measured fundamental components, i.e., measured x-y phasors, of the electrical system voltage. Further, with its phasor-based locking operations and with its timer/counter-based operation, the PLL circuit can be implemented partly or wholly in digital processing logic.

22 Claims, 11 Drawing Sheets

METHOD AND APPARATUS FOR SIGNAL PHASE LOCKING

BACKGROUND OF THE INVENTION

The present invention generally relates to ac devices, and particularly relates to synchronizing the operation of such devices to ac electrical systems.

Power measurement devices, such as electronic metering devices, are commonplace, and power conversion devices, such as dc-ac power inverters, are becoming more commonplace with the increased interest in alternative energy systems to provide localized power generation. Characteristically, these devices must synchronize themselves to an electrical system of interest. For example, electronic power meters synchronize their measurement operations with respect to the electrical system supplying the measured power. Similarly, localized alternative energy systems often are required to operate in grid-connected modes, wherein they are interconnected with an external electrical system, such as a utility company's power distribution grid.

Thus, there is a need for these ac electrical devices to lock with the phase and frequency of the electrical system. Approaches to phase locking in a three-phase electrical system typically exploit the three-phase nature of the electrical signals and synchronize a rotating reference frame to the three-phase system. Such approaches are not amenable to single-phase electrical systems. Zero crossing detection represents one approach to frequency detection and/or phase locking with respect to single phase electrical systems, wherein detection of the single-phase waveform's zero crossings is used to determine the system phase and frequency. Under nominal conditions, zero crossing detection provides a straightforward means of phase/frequency locking, but the approach suffers from its vulnerability to noise occurring at or around the zero crossing points.

SUMMARY OF THE INVENTION

The present invention comprises a method and apparatus for locking to the frequency and/or phase of a signal of interest. Although not limited to such applications, a Phase Locked Loop (PLL) circuit configured in accordance with the present invention is particularly advantageous for locking ac devices, such as ac inverters, ac power monitors, etc., to power distribution grids or other electrical system voltages.

In an exemplary embodiment, the present invention comprises a computer readable medium storing a computer program to implement a PLL, wherein the computer program comprises program instructions to generate a product signal by multiplying an input signal of interest with a PLL output signal to be locked with the input signal, program instructions to generate a substantially dc phase error signal by averaging the product signal over half-cycles of a waveform period of interest, program instructions to generate a frequency correction signal based on proportional-integral processing of the phase error signal, and program instructions to generate the PLL output signal by clocking through a waveform lookup table at a desired clock rate, and to adjust that clock rate as a function of the phase error signal. As such, the PLL can be implemented in a digital signal processor, and thus can be integrated into an overall digital control circuit.

More broadly, the present invention comprises a method of locking to a frequency and phase of an input signal of interest, the method comprising generating a PLL output signal to be locked with a frequency and phase of a periodic input signal of interest, multiplying the input signal of interest by the PLL output signal to generate a product signal and filtering the product signal over a desired number of half-cycles to generate a substantially dc phase error term, calculating a frequency correction signal from the phase error term, and adjusting a frequency of the PLL output signal responsive to the frequency correction signal to lock the output signal to the input signal. The method can further comprise detecting a locked condition of the PLL output signal based on averaging a magnitude of the frequency correction signal over a desired number of waveform periods, or overriding the frequency correction signal for operation in a standalone mode, wherein an output frequency of the PLL output signal is set by a nominal output signal period.

Thus, an exemplary PLL circuit comprises a phase detector circuit configured to generate a product signal by multiplying an input signal of interest with a PLL output signal to be locked with the input signal, and configured to generate a phase error signal by averaging the product signal over half-cycles of a waveform period of interest, a loop filter circuit to generate a frequency correction signal by filtering the phase error signal, and an oscillator circuit configured to generate the PLL output signal by clocking through a waveform lookup table at a desired clock rate, and to adjust that clock rate as a function of the phase error signal. The phase detector, loop filter, and oscillator circuits can comprise digital circuits implemented in a digital processor and, as such, can be implemented in hardware, software, or some combination thereof.

Those skilled in the art should appreciate that the present invention is not limited by the foregoing description. Indeed, those skilled in the art will recognize its additional features and advantages upon reading the following detailed description, and upon viewing the accompanying drawings wherein like reference numbers refer to like drawing elements.

DETAILED DESCRIPTION OF THE INVENTION

Figure 1A:
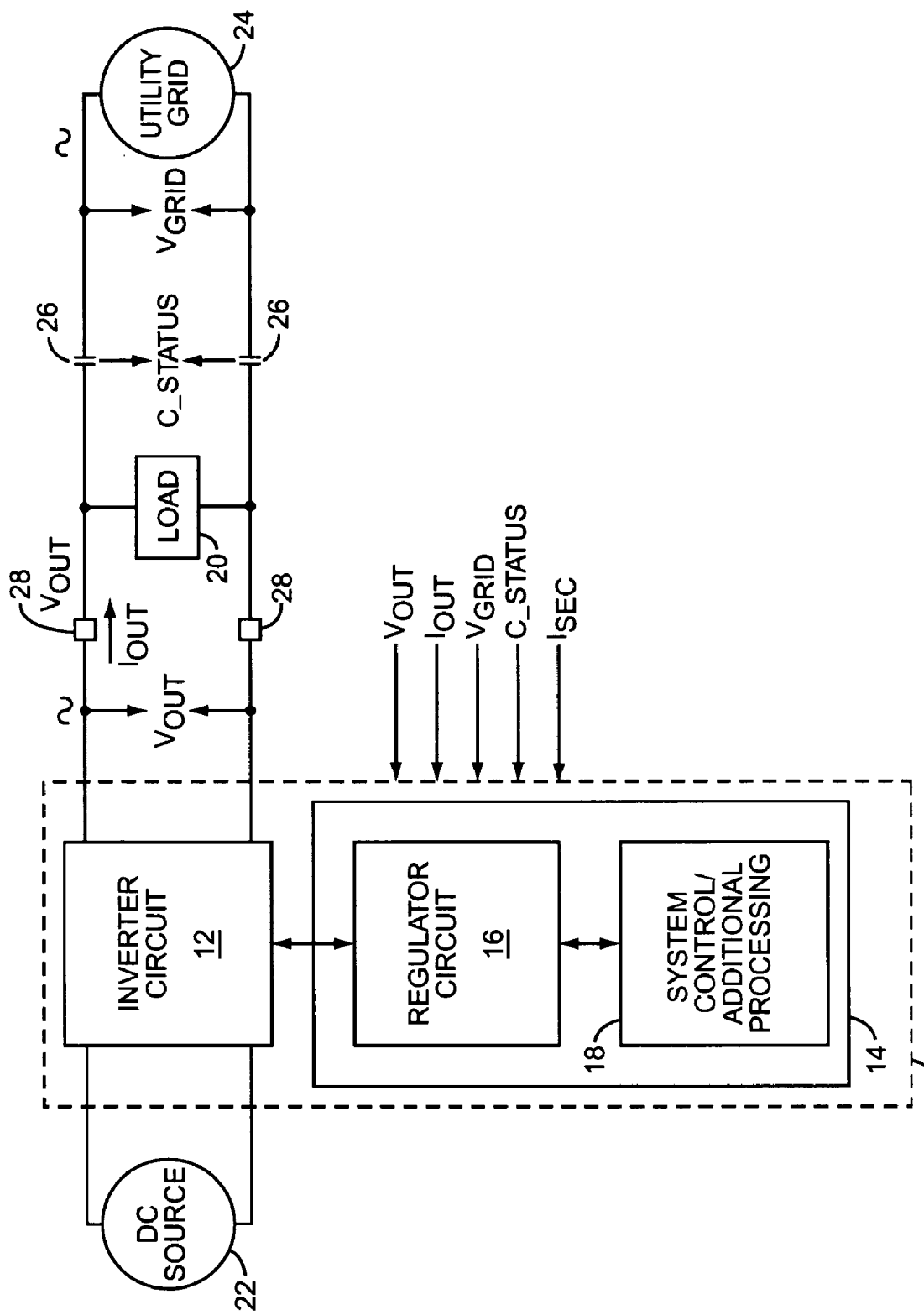
FIGS. 1A, 1B, and 1C are diagrams of an ac power inverter according to one or more exemplary embodiments of the present invention.

In one or more exemplary embodiments, the present invention comprises a PLL circuit that enables an ac device to lock with an electrical system voltage. FIG. 1A illustrates an exemplary ac power inverter 10 in which the present invention can be practiced. Inverter 10 comprises an inverter circuit 12 and a control circuit 14, which can include multiple functional circuits, including a regulator circuit 16, and one or more additional processing and system control circuits 18. While not limited to such configurations, an exemplary PLL circuit according to the present invention is implemented within the digital signal processing logic of control circuits 18.

Inverter 10 provides ac power to a load 20 based on converting dc power provided by a local dc source 22 into ac power at the desired voltage and frequency. The load 20 can be connected in parallel with an external power system 24, e.g., a utility grid, through contactors 26. Complementing its operation in this arrangement, inverter 10 can be configured to receive a number of feedback/detection signals, including signals corresponding to its output voltage ($V_{OUT}$) and current ($I_{OUT}$), the grid voltage ($V_{GRID}$), the contactor status (C_STATUS), and to a secondary winding current ($I_{SEC}$) that is illustrated in FIG. 1B.

Figure 1B:
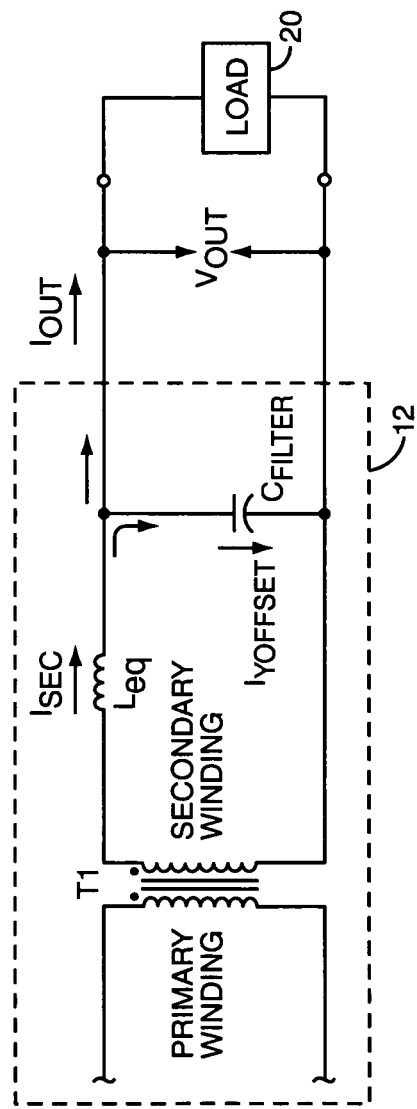

FIG. 1B does not depict the entire inverter circuit 12 but illustrates that an exemplary inverter circuit 12 includes an output transformer T1 comprising primary and secondary windings, and further includes an output filter formed by a filter inductor, $L_{eq}$, and a filter capacitor, $C_{FILTER}$. The filter inductance can be a separate element (component), or can be the leakage inductance of transformer T1. Use of the output filter attenuates the higher frequency components in the inverter's output that naturally arise from Pulse Width Modulation (PWM) based or other switching based dc-to-ac conversion operations implemented by it. One notes that the secondary current, $I_{SEC}$, comprises the inverter output current, $I_{OUT}$, plus the filter current, i.e., the portion of the secondary winding current diverted through $C_{FILTER}$.

Both $I_{SEC}$ and $I_{OUT}$ can be sensed using Current Transformers (CT's) 28 or other types of current measurement sensors. Regardless of how it is sensed, $I_{OUT}$ indicates current flowing into or out of the inverter 10. Note that $I_{OUT}$ can be sensed inferentially, such as by measuring the secondary winding current of transformer T1 rather than directly measuring it using current transformers (CTs) 28.

Figure 1C:
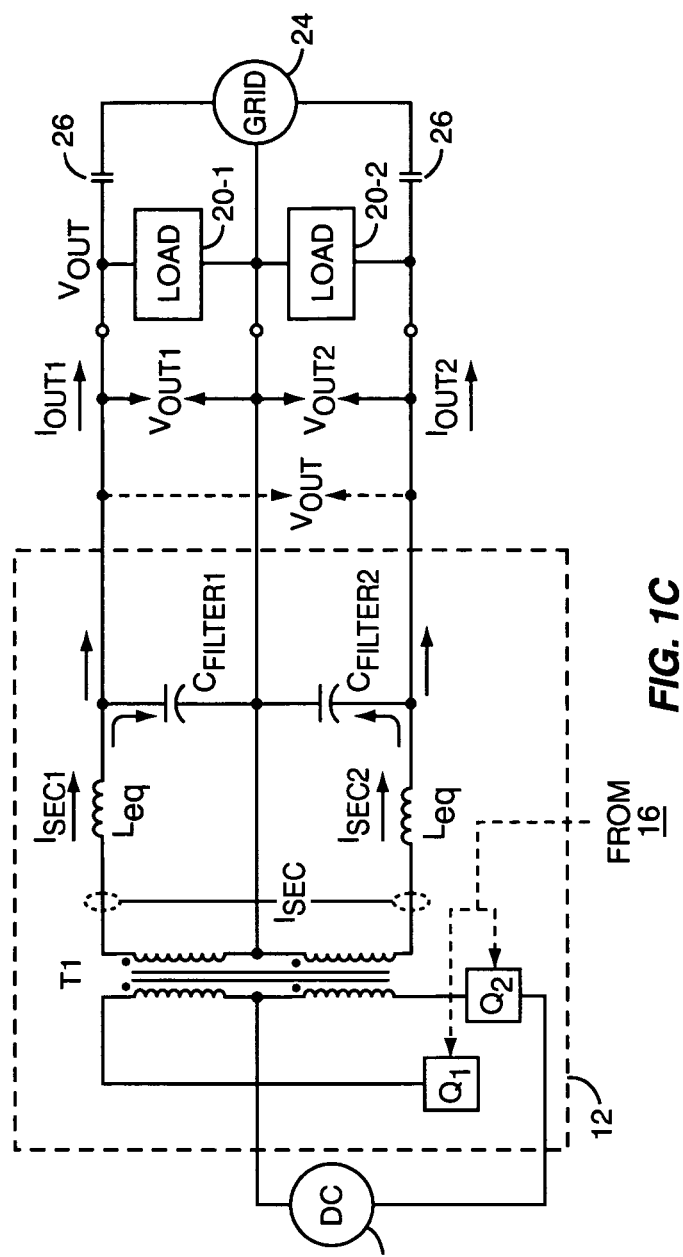

FIG. 1C illustrates an exemplary embodiment configured for three-wire (two line-to-neutral pairs) as typically is used in "service entrance" connections between local loads 20-1 and 20-2 and the grid 24 in the United States, for example. The output transformer T1 comprises split primary and secondary windings, with the neutral wire electrically connected to the center tap of the secondary winding such that one half of the transformer's secondary winding provides $I_{OUT1}$ and $V_{OUT1}$ to load 20-1, and the other half provides $I_{OUT2}$ and $V_{OUT2}$ to load 20-2. Thus, with this configuration, inverter 10 effectively provides two output phases, although the phase voltage in one phase tracks the other and both loads 20-1 and 20-2 see the same line-to-neutral voltage levels.

Secondary winding current comprises $I_{SEC1}$ plus $I_{SEC2}$ and, likewise, the inverter's output current $I_{OUT}$ comprises $I_{OUT1}$ plus $I_{OUT2}$, and its output voltage, $V_{OUT}$ comprises $V_{OUT1}$ plus $V_{OUT2}$. Thus, even where inverter 10 is configured for a three-wire output circuit as shown, the overall control method can be based on the total currents and voltages taken across the two phases and the overall inverter control effectively operates as a single-phase control. That is, inverter 10 can base its regulation control on the summation of currents and voltages in the two phases. With that method, the total current and voltage is controlled according to exemplary methods described herein, and the differences between loads 20-1 and 20-2 determine how the total current splits between the phases.

When operating in Grid Parallel mode (assuming that the grid's voltage and frequency are within nominal ranges) inverter 10 controls its output to match the grid 24. In an exemplary overall control method, inverter 10 controls or regulates its output voltage waveform ($V_{OUT}$) to match the amplitude and phase of the grid voltage, which amounts to tracking and matching the grid's voltage and frequency. Inverter 10 thus can monitor line voltage and frequency and use them to maintain its output. Of course, if inverter 10 detects out-of-range grid conditions, it can open contactors 26 and operate in Stand Alone mode until it detects that nominal grid conditions have been restored.

Inverter 10 embodies an advantageous output control method that is based on separate control of the real and reactive power output by inverter 10. In an exemplary embodiment, which can be implemented almost entirely in the digital domain, inverter 10 calculates its real and reactive output power based on calculating x-y phasors for its output voltage and current waveforms, which can be digitized. It generates an inverter control signal, e.g., a PWM-based switching control signal for inverter circuit 12, to adjust the inverter's output based on the differences between measured real and reactive power and desired values for real and reactive power.

In Stand Alone mode, the voltage waveform can be regulated as needed or desired and the power draw is determined by the load, but in Grid Parallel mode, the desired values can be referenced to the grid and adjusted for the desired net power flow between the inverter 10 and the grid 24. To that end, inverter 10 can receive a feedback or other measurement signal from a sensor measuring net power flow at a service entrance or other point of interconnection between the inverter 10 and the grid 24. Inverter 10 can thus be configured to sense whether it is injecting power into the grid 24 or drawing power from it.

Figure 2A:
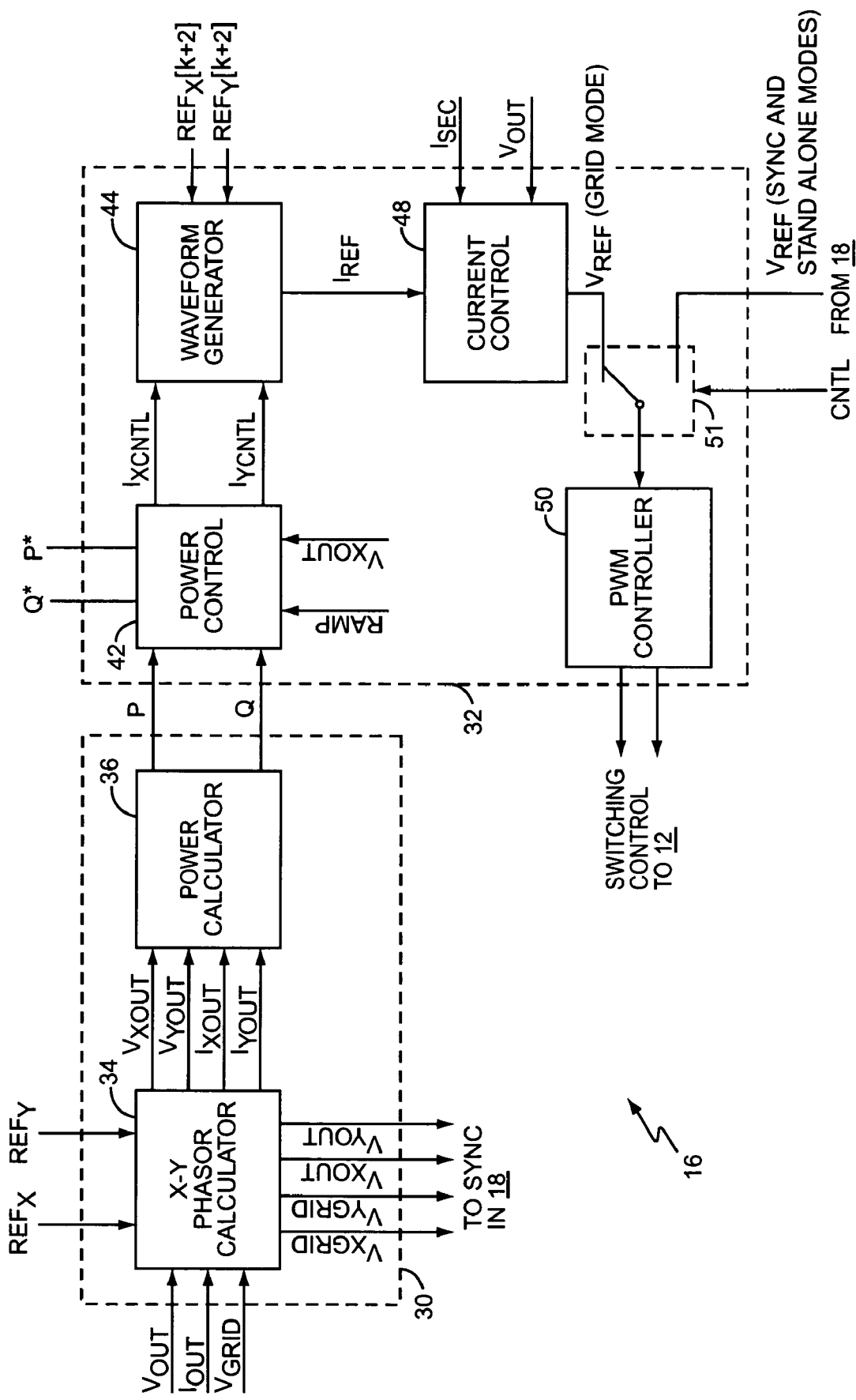
FIGS. 2A and 2B are diagrams of exemplary phasor-based inverter regulator circuits.

FIG. 2A illustrates an exemplary regulator circuit 16, which can be configured to control inverter 10 based on real and reactive power control as described above. In an exemplary embodiment, regulation of the inverter's output comprises an outer control loop driven by differences in measured and desired values of real and reactive inverter power output, and an inner loop driven by control inputs generated by the outer loop, and by voltage and current feedback from the inverter.

More particular, an exemplary regulator 16 generates current commands ($I_{XCNTL}$ and $I_{YCNTL}$) based on the differences between measured and desired real and reactive power and from them generates a reference current waveform, $I_{REF}$. The $I_{REF}$ signal, which can be generated in terms of x and y components, is then used to set a reference voltage, $V_{REF}$, that is updated via the control to produce desired changes in the inverter current. These exemplary control processes are detailed below.

An exemplary regulator 16 comprises a measurement circuit 30 and a feedback control circuit 32. The exemplary measurement circuit 30 includes a phasor calculator 34 and a power calculator 36. The exemplary feedback control circuit 32 includes a power controller 42, a waveform generator 44, current controller 48, and an inverter circuit switching controller 50, e.g. a PWM signal generator. A logical switch 51 can be used to control whether the switching controller 50 is driven by the current controller 48, as it is in Grid Parallel mode, or by a voltage synchronization circuit (shown later herein), as it is in a synchronization or stand alone modes. When switch 51 is switched to the $V_{REF}$ signal generated by controller 48, inverter 10 operates according to output current/power regulation control, and when switch 51 is switched to the $V_{REF}$ signal generated during synchronization and stand alone modes, inverter 10 operates according to output voltage regulation control.

Figure 2B:
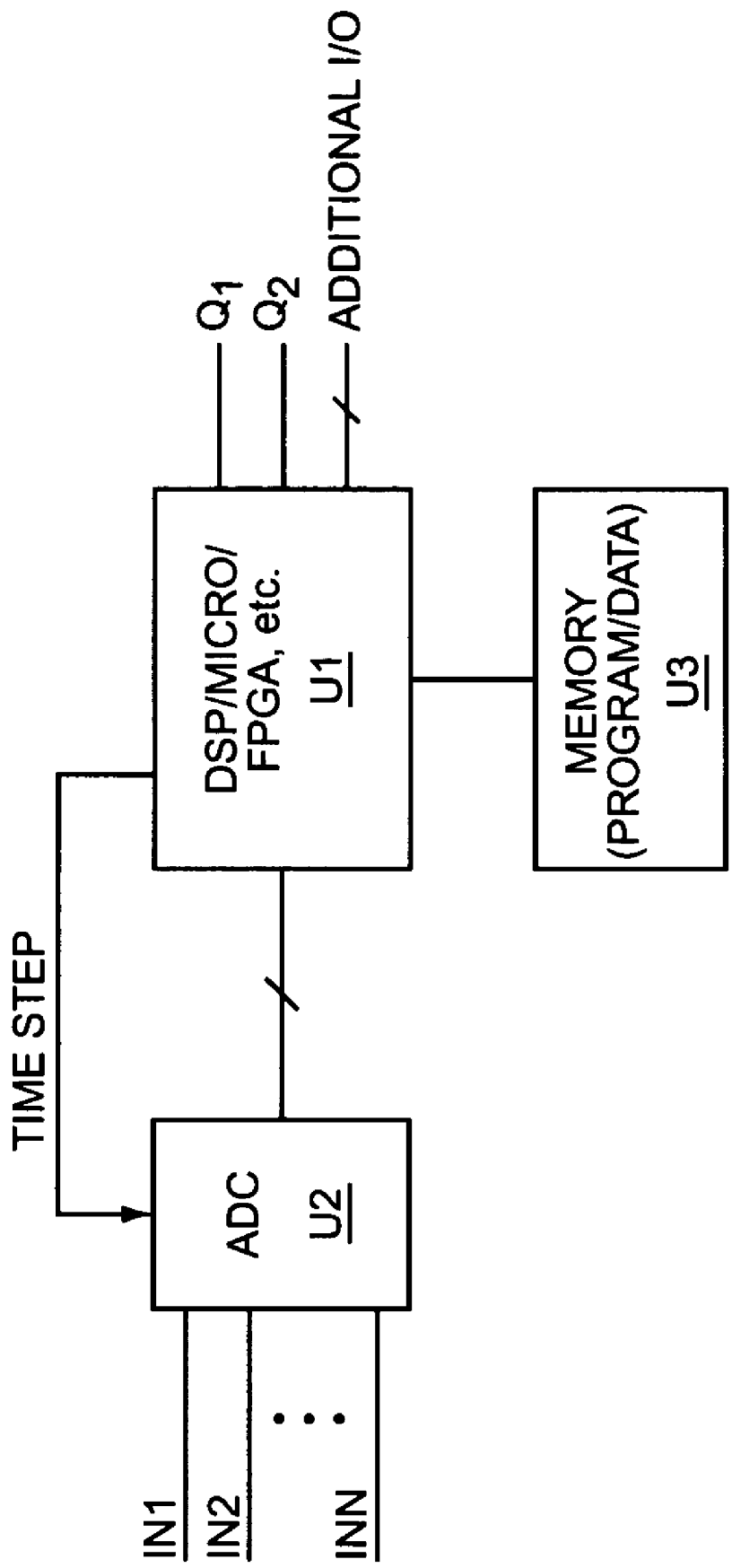

FIG. 2B illustrates an exemplary digital signal processing embodiment for control circuit 14, including one or more integrated circuits, a processor U1, analog-to-digital converter(s) U2, and program/data memory device(s) U3. Thus, regulator circuit 16 can be embodied in whole or in part as a computer program (software, firmware, or microcode, etc.) executing on a digital signal processor (DSP) such as a TMS320C24x series DSP from Texas Instruments.

Of course, it should be understood that a processor-based implementation of regulator 16 is not limiting and its functionality can be embodied in software, hardware, or any combination thereof. The ADCs can be used to move input signals between the analog and digital domains as needed or desired. Discrete (switch) outputs from processor U1 can be used to control the inverter circuit 12 as desired.

Regardless of the particular implementation details, the exemplary phasor calculator 34 generates x-y phasors for feedback signals corresponding to the inverter's output voltage and current waveforms and, in grid-connected operation, for the grid voltage. Reference signals $REF_X$ and $REF_Y$ establish the x-y coordinate frame used by phasor calculator 34. In an exemplary embodiment, a PLL circuit that is locked to the frequency/phase of the grid voltage generates the reference signals—an exemplary PLL circuit is illustrated and described in much greater detail later herein. The reference signal $REF_X$ establishes the in-phase (x) coordinate frame axis and $REF_Y$ establishes the quadrature (y) coordinate frame axis. In an exemplary embodiment, $REF_X$ and $REF_Y$ are referenced to the grid voltage, which is deemed to have zero phase, i.e., the grid voltage establishes the in-phase (x) reference point for the x-y coordinate frame. In Stand Alone mode, the x-y reference frame is based on internal timing established by frequency/phase locking circuits included in control circuit 14. In particular, an exemplary PLL circuit described in detail later herein can be configured according to one or more embodiments of the present invention to provide x-y reference frame signals, as well as other control timing signals.

Phasor calculator 34 can be particularly adapted for the calculation of phasor components in single-phase inverter configurations. A sinusoidal voltage waveform can be represented by the equation, $$v(t) = V\cos(\omega)(t+\phi) = Re\{Ve^{j\omega t}\}. \quad (1)$$

One can represent the phasor amplitude V as a complex number expressed as a magnitude and phase, or as real and imaginary parts, as follows, $$V = V_x + jV_y \text{ or } V = |V|e^{j\phi} = V_x + jV_y, \quad (2)$$

where x and y phasor values for V can be determined as, $$V_x = |V|\cos(\phi), \text{ and} \quad (3)$$

$$V_y = |V|\sin(\phi). \quad (4)$$

In single-phase applications, phasor-calculator 34 averages over half-cycles of the fundamental waveform period to obtain correctly computed x-y phasor components for voltage and current waveforms. An exemplary phasor-calculator 34 can be configured to perform such integration by averaging over an integer number of half-cycles.

Figure 5:
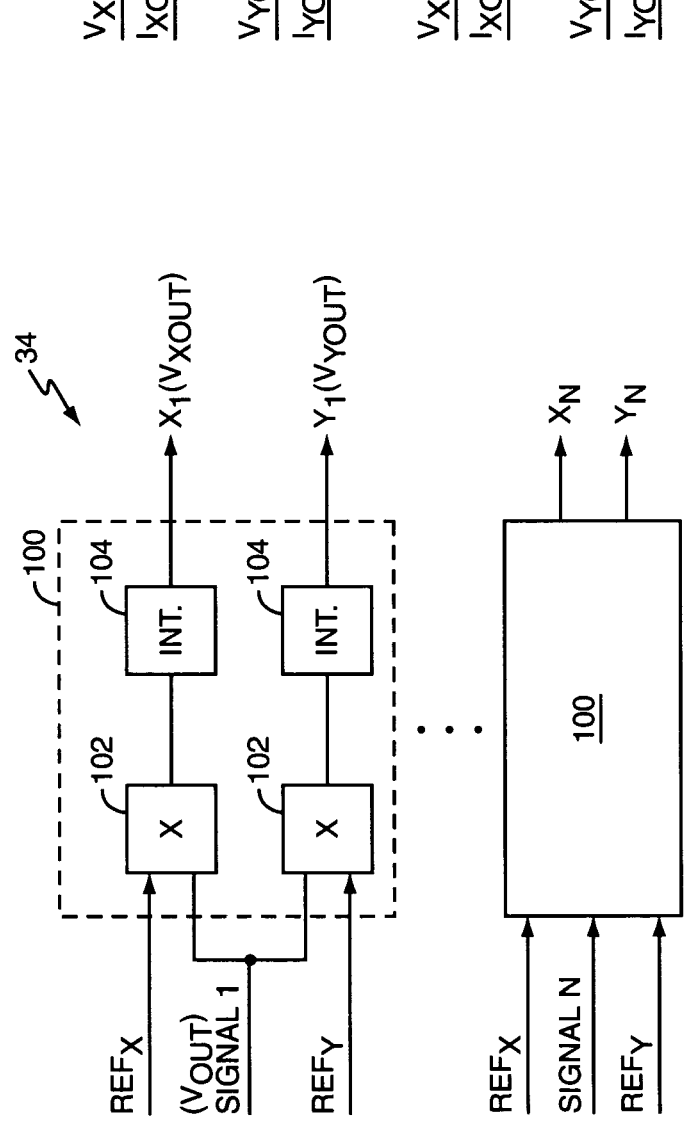
FIG. 5 is a diagram of an exemplary phasor calculator.

FIG. 5 illustrates an exemplary configuration for phasor calculator 34 that includes a calculation circuit 100 for each input signal being processed by phasor calculator 34. Circuit 100 comprises a pair of multipliers 102 that separately multiply the input signal ($V_{OUT}$, $V_{GRID}$, or $I_{OUT}$, etc.) by the in-phase and quadrature reference signals, $REF_X$ and $REF_Y$. Each multiplier's output feeds into one of the integrators 104, which performs the half-cycle averaging. Thus, phasor calculator 34 generates in-phase and quadrature fundamental components—Fourier components—for the inverter's output voltage and current, and for the grid voltage. Power calculator 36 (FIG. 6) receives the $V_{XOUT}$, $V_{YOUT}$, $I_{XOUT}$, and $I_{YOUT}$ fundamental components for inverter voltage and current, and from them computes the fundamental real and reactive power being output by inverter 10 based on summing selected product terms. With the x-y phasor components for voltage and current, the inverter's real power can be determined by, $$P = \frac{1}{2}\text{Re}\{V_A I_A^*\} = \frac{1}{2}(V_{XA}I_{XA} + V_{YA}I_{YA}), \quad (5)$$

where * represents the complex conjugate, and reactive power can be determined as, $$Q = \frac{1}{2}\text{Im}\{V_A I_A^*\} = \frac{1}{2}(V_{YA}I_{XA} - V_{XA}I_{YA}). \quad (6)$$

Figure 6:
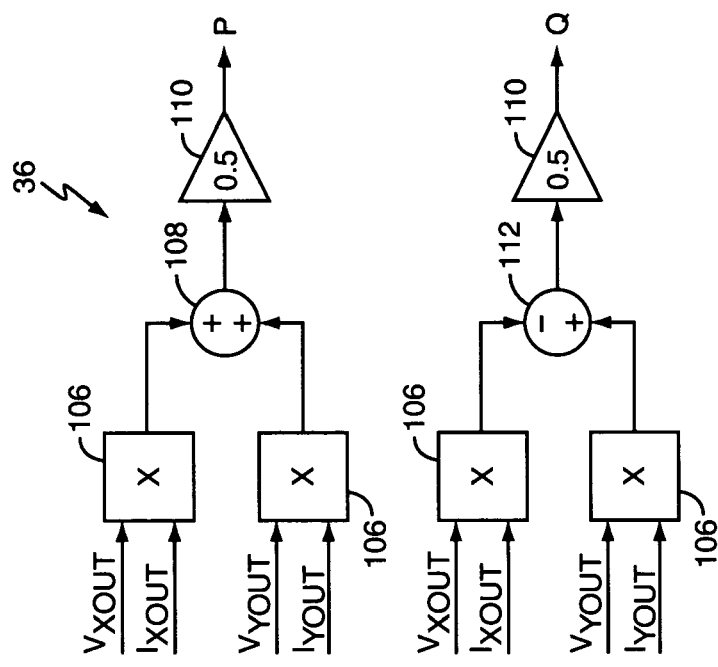
FIG. 6 is a diagram of an exemplary phasor-based power calculator.

FIG. 6 illustrates an exemplary embodiment for power calculator 36 to implement Eqs. (5) and (6) that includes four input multipliers 106 that are paired together with respect to summing circuits 108 and 112, respectively. Summing circuit 108 outputs a signal based on adding $V_{XOUT}I_{XOUT}$ to $V_{YOUT}I_{YOUT}$, which sum is then scaled by one-half in a first gain circuit 110 to produce the real power measurement value P (Watts). Summing circuit 112 outputs a signal based on subtracting $V_{XOUT}I_{YOUT}$ from $V_{YOUT}I_{XOUT}$, which result is then scaled by one-half in a second gain circuit 110 to produce the reactive power measurement Q (Vars).

Power controller 42 (FIG. 3) receives commanded values of real and reactive power, P* and Q*, measured values of real and reactive power, P and Q, and a power command ramp signal [RAMP]. The controller outputs are command values of x-axis and y-axis phasor currents.

The controller 42 uses the command values P* and Q* themselves as feedforward command signals. In addition, the controller 42 computes the error between the desired and measured real power, and the desired and measured reactive power. These error signals are input to P/I regulators 54, which null out steady state errors in the power control loop. The P/I outputs are summed with the feedforward command values at summing junctions 56. The resulting signals, which have units of power, are divided by the magnitude of the terminal voltage to yield the command values of x-axis ($I_{XOUTREF}$) and y-axis ($I_{YOUTREF}$) phasor currents.

The RAMP signal is a Boolean variable that is asserted when the command values P* and Q* are changing. When the values of P* and Q* are constant, the RAMP signal is low and the error signals are input to the P/I regulators 54. The P/I regulators 54 act to reduce the steady state errors to zero. Asserting the RAMP signal during changing values of P* and Q* causes the switch 52 to toggle, placing a zero at the input to the P/I regulators 54. This action effectively disables the P/I regulators 54 during changes in the command values and prevents integrator windup.

Figure 3:
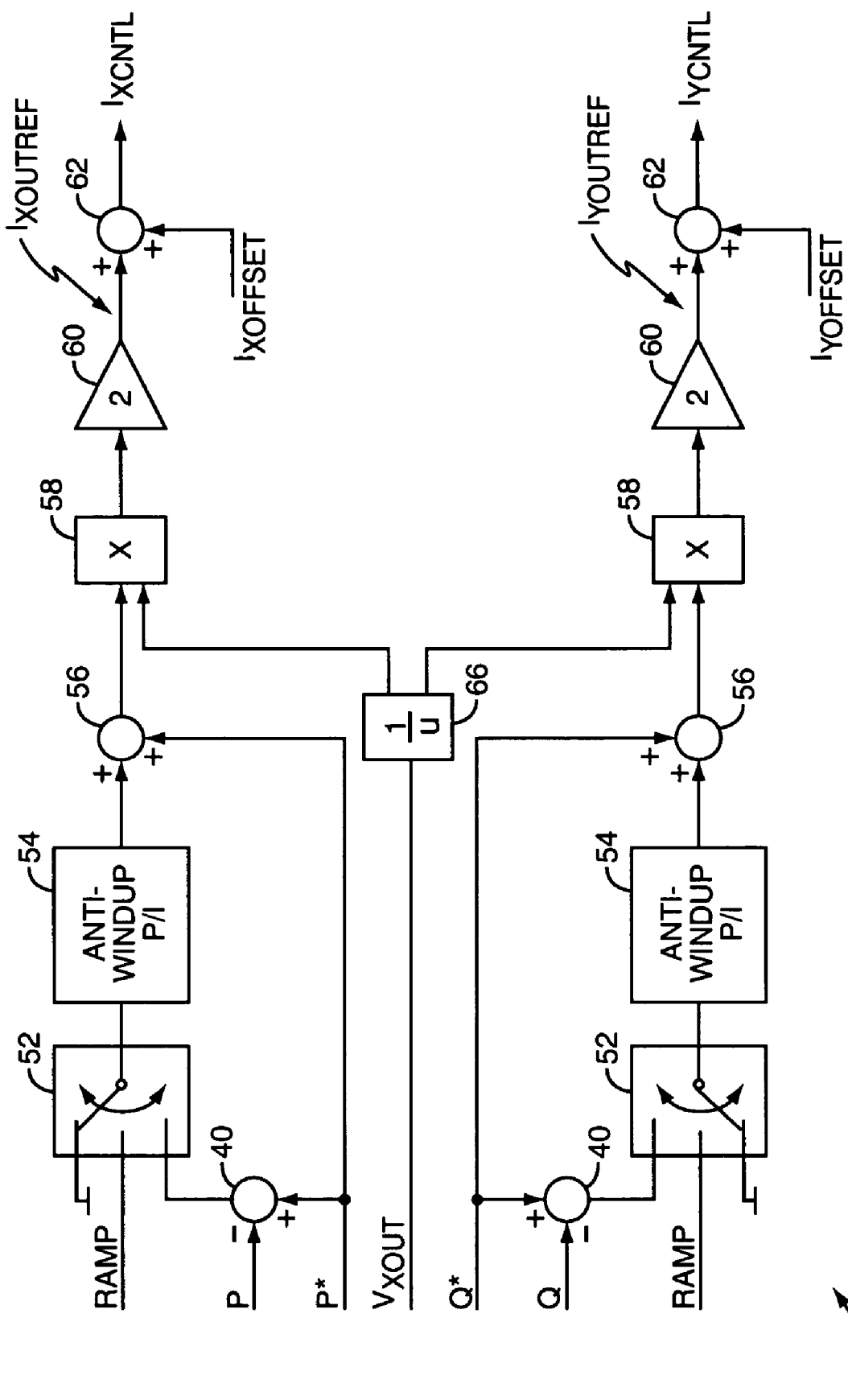
FIG. 3 is a diagram of an exemplary phasor-based power controller.

FIG. 3 illustrates an exemplary embodiment of power controller 42, which comprises substantially identical first and second power control signal paths including first and second switches 52, first and second anti-windup Proportional-Integral (P/I) regulators 54, first and second summing circuits 56, first and second multipliers 58, and first and second gain circuits 60. Both signal paths further include summing circuit 62, and both paths share a 1/u multiplier 66 that provides the inverse value of $V_{XOUT}$ to the first and second multipliers 58.

In looking at the real power control signal path, the first switch 52, controlled by the ramp signal RAMP, provides the first P/I regulator 54 with either a zero (default) signal, or the real power error signal (P–P*). The first P/I regulator 54 provides its output signal to the first summing circuit 56, which sums the P/I signal with the desired real power signal P*. That sum feeds into the first multiplier 58, where it is multiplied by $1/V_{XOUT}$. The product is scaled by the first gain circuit 60 to generate a dc domain current $I_{XOUTREF}$ that is summed in a second summing circuit 62 with a signal termed $I_{XOFFSET}$ to form a control signal, $I_{XCNTL}$. The signal $I_{XCNTL}$ corresponds to the in-phase inverter output current needed to reduce the difference between the measured and desired real power.

The $I_{XOFFSET}$ signal can be generated by multiplying $V_{XOUT}$ by known admittance values representing, e.g., capacitor and fan loads. Thus, $I_{XOFFSET}$ can be generated as compensation for no-load currents of inverter 10 according to $I_{XOFFSET}=Y_X V_{XOUT}$, where $Y_X$ represents an admittance value. Alternatively, $I_{XOFFSET}$ can be set to a fixed value based on expected voltage and admittance values.

Similar processing is used for the reactive power, and results in generation of the $I_{YCNTL}$ current control signal corresponding to the quadrature inverter output current needed to reduce the difference between the measured and desired reactive power. As with the x-component, $I_{YCNTL}$ can be compensated or otherwise adjusted using an $I_{YOFFSET}$ signal calculated like the $I_{XOFFSET}$ signal but using y-components.

The substantially dc in-phase and quadrature current control signals, $I_{XCNTL}$ and $I_{YCNTL}$, feed into waveform generator 44, which use time-step advanced versions of the $REF_X$ and $REF_Y$ signals to convert them into a combined ac waveform, $I_{REF}$, representing the desired instantaneous value of inverter output current, $I_{OUT}$, desired for inverter 10.

Figure 7:
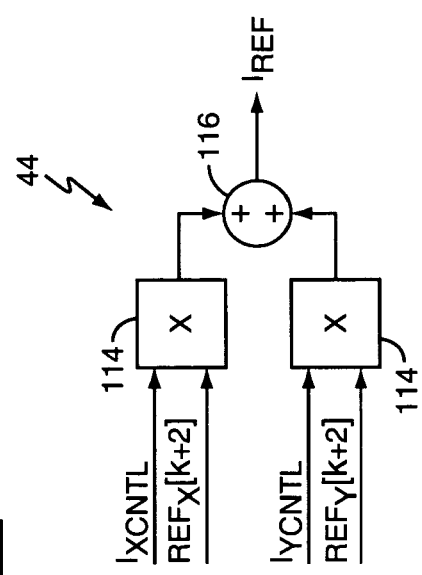
FIG. 7 is a diagram of an exemplary phasor-to-ac waveform generator.

FIG. 7 illustrates an exemplary embodiment of waveform generator 44, which comprises first and second input multipliers 114, and an output summing circuit 116 to provide $I_{REF}$. The first multiplier 114 multiplies $I_{XCNTL}$ by the $REF_X$ waveform and the second multiplier performs the same operation on $I_{YCNTL}$ but uses the $REF_Y$ waveform. Generator 44 thus generates in-phase and quadrature (sinusoidal) waveforms corresponding to desired in-phase and quadrature components of the inverter's output current $I_{OUT}$ and sums them to provide $I_{REF}$.

Figure 4A:
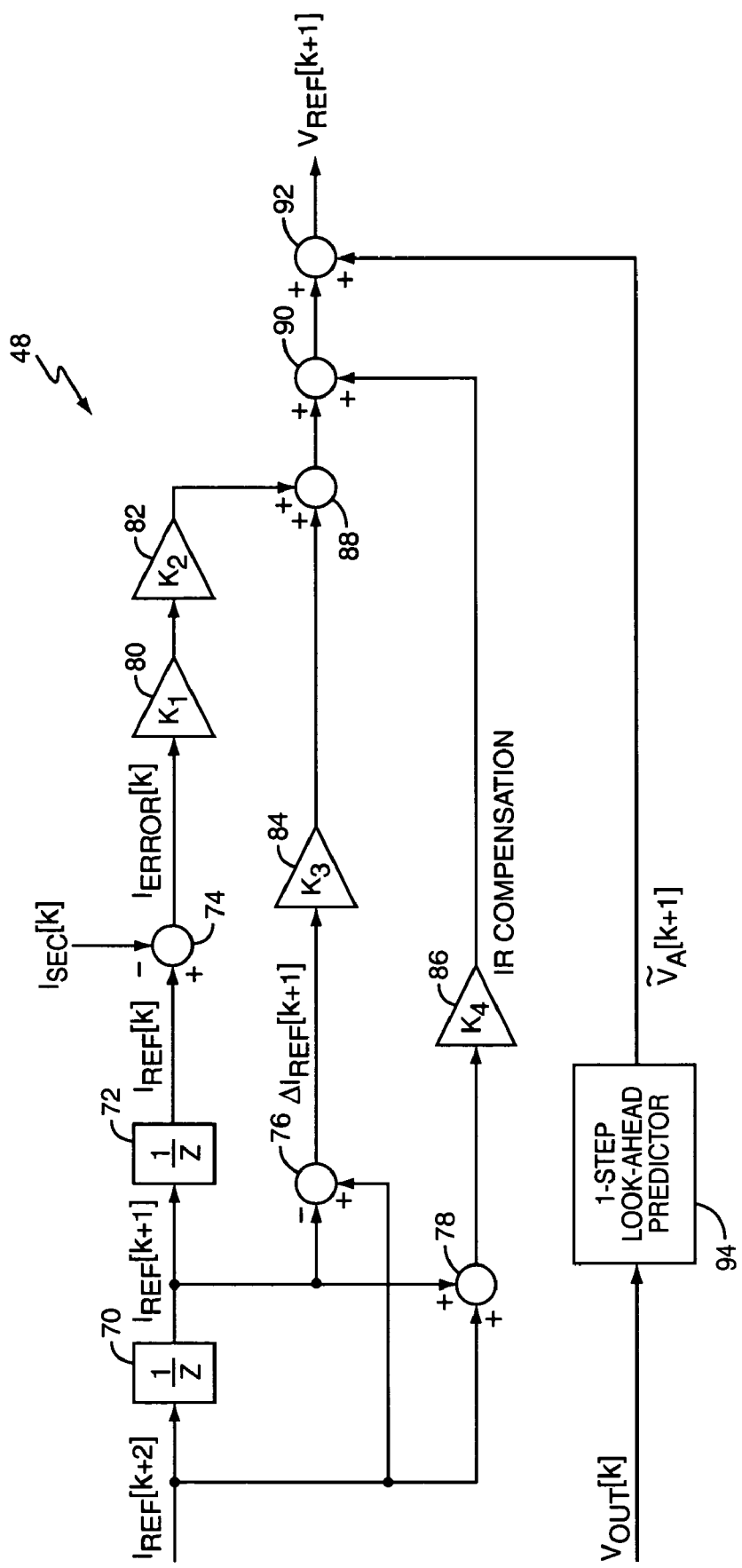
FIG. 4A is a diagram of an exemplary current controller.

Current controller 48 receives $I_{REF}[k+2]$ as a control input, and receives $I_{SEC}[K]$ and $V_{OUT}$ as feedback signals. FIG. 4A illustrates an exemplary current controller 48, which comprises delay circuits 70 and 72, summing circuits 74, 76, and 78, gain circuits 80, 82, 84, and 86, summing circuits 88, 90, and 92, and look-ahead circuit 94.

Together, these circuits provide an inverter control signal $V_{REF}$, which controls the output from inverter circuit 12. The control input signal $I_{REF}[k+2]$ is already advanced by 2 time steps at the point where it is generated by waveform generator 44. The delay circuits 70 and 72 for $I_{REF}$ generate two additional versions of the control signal $I_{REF}[k+1]$ and $I_{REF}[k]$, advanced by 1 time step and zero time steps, respectively. Summing circuit 76 generates a difference signal $\Delta I_{REF}[k+1]$, representing the anticipated change in the $I_{REF}$ control input over the next time interval. Gain circuit 84 converts the anticipated current change into a voltage to be applied across the inverter's equivalent series inductance $L_{eq}$, in order to drive the anticipated current change.

In addition to the anticipated change in the $I_{REF}$ control input, there will generally be some error $I_{ERROR}[k]$ between the desired current value $I_{REF}[k]$ and the actual (measured) current value $I_{SEC}[k]$. Summing circuit 74 measures the current error $I_{ERROR}[k]$, and gain circuits 80 and 82 convert the current error into a voltage correction to be applied to the series inductance $L_{eq}$ to correct for the error. Summing circuit 78 and gain circuit 86 serve to calculate an additional correction for voltage drops due to the inverter's equivalent series resistance. Summing circuits 88 and 90 serve to add the two correction signals to the original voltage calculation from gain circuit 84, to yield a total voltage to be applied across $L_{eq}$.

Look-ahead circuit 94 generates a prediction of the inverter output voltage $V_{OUT}$ at the next time step, using a linear predictor that is optimized for sinusoidal voltage signals. Summing circuit 92 then adds the predicted output voltage to the required voltage across $L_{eq}$, to yield a voltage command $V_{REF}[k+1]$ to be applied to the inverter during the next time step.

Figure 4B:
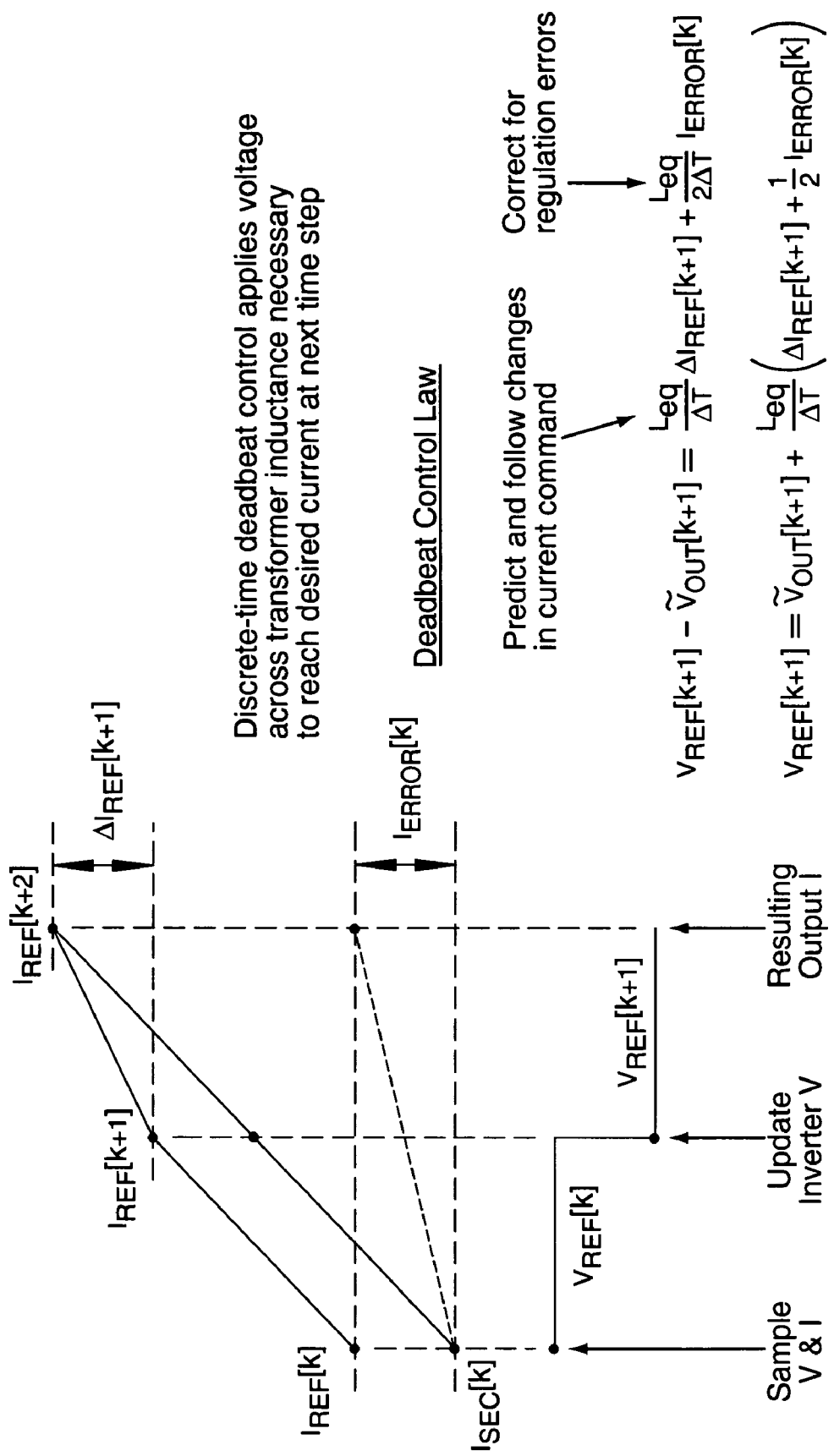
FIG. 4B is a diagram of exemplary control details for the controller of FIG. 4A.

Thus, as detailed above, and as graphically depicted in FIG. 4B, exemplary control law delays provided by current controller 48 account for the difference between measuring the inverter's output and commanding a change in that output, i.e., the control loop delay between commanding a change in inverter voltage and measuring the current corresponding to that change. In the illustrated embodiment, the current and voltage measurements performed at sample time k are used to calculate the inverter voltage to be applied at time k+1, which in turn will result in changes in the inverter's output current at time k+2, thus accounting for the two $z^{-1}$ delays in the control path.

Finally, switching controller 50 generates inverter switching control signals responsive to the $V_{REF}$ signal output by current controller 48. For the switching network shown in FIG. 1C, an exemplary switching controller can be configured as a PWM signal generator that outputs complementary pulse trains for switching transistor circuits Q1 and Q2 on and off according to pulse width timing determined from $V_{REF}$.

Thus, the inverter's output is matched to the required (or desired) magnitude, frequency, and phase not by directly setting current and voltage phases and magnitudes but rather by referencing the inverter's x-y coordinate frame to a desired anchor point, e.g., the grid voltage, and controlling the real and reactive powers measured for the inverter in relation to desired real and reactive powers. That method has the added advantage of transforming most control variables into substantially dc values and enables relatively straightforward phasor-based control law calculations.

Reliable islanding detection is among the many advantages accruing from the ability to accurately control real and reactive power. With grid-connected operation, the possibility exists that a portion of the grid 24 connected to the inverter 10 will become isolated from the rest of grid 24, e.g., the "service hookup" and associated local feeder lines that provide power from the grid 24 to load 20. Under such conditions, inverter 10 can keep the islanded portion of grid 24 energized, creating a potentially hazardous condition for service personnel and anyone else that is unaware of the island's energized condition.

If the load's local feeder lines are connected to the grid 24 and grid 24 is operating within nominal conditions, changes in the inverter's output affect power quality and net power flow between the inverter 10 and the grid 24, but those changes do not disturb the grid's line frequency and voltage.

From the inverter's perspective, grid 24 looks like a very stiff voltage source that essentially cannot be disturbed by variations in the inverter's output. However, that is not true when the load's local feeder lines become disconnected from the grid 24.

In particular, when the load's local feeder lines are connected to the grid 24, changes in the reactive power output by the inverter 10 change the power factor associated with inverter 10 but do not change the line frequency. If the feeder lines become isolated, such that they and the load are driven only by the inverter 10, changing the inverter's reactive power output shifts the inverter's output frequency. With independent real and reactive power control, inverter 10 thus can be configured to detect islanding by changing its reactive power output and monitoring for any resulting change in frequency.

When operating in Stand Alone mode, control circuit 14 changes the reference for the x-y coordinate frame from the grid voltage to an internally generated reference framework. Thus, the x and y axes of the coordinate frame can be selectively established by an internal in-phase and quadrature reference circuit, or by the grid's frequency and phase. The ability to set the reference for the x-y coordinate frame on either internal or external references enables the x-y based control scheme to operate in either Grid Parallel or Stand Alone modes, and to smoothly change between modes.

Figure 8:
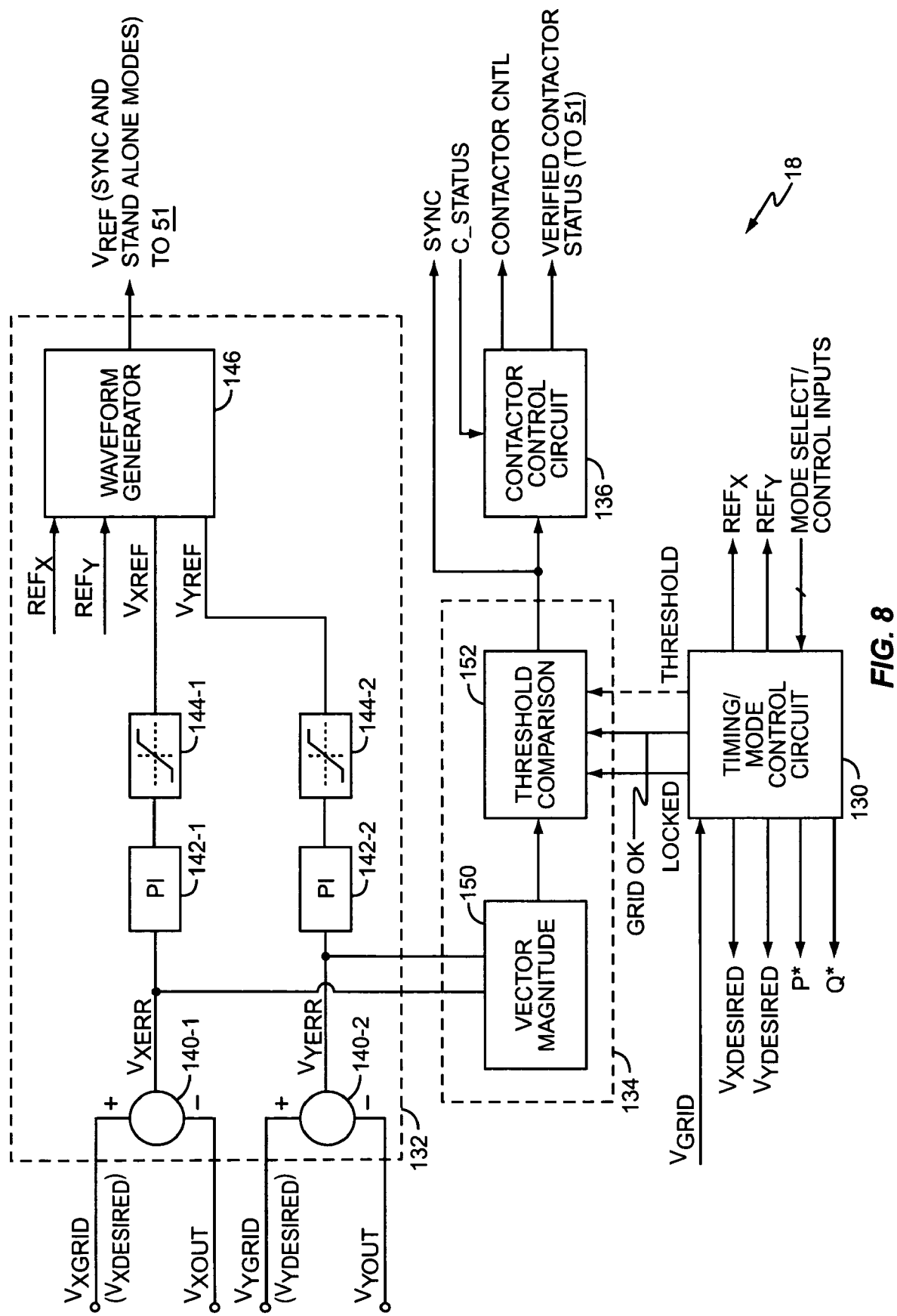
FIG. 8 is a diagram of an exemplary control circuit including synchronization, contactor, timing, and mode control circuits.

In particular, with respect to changing from Stand Alone mode to Grid Parallel mode, the control must match the inverter's output voltage to the ac mains voltage of grid 24. That is, inverter 10 must synchronize to grid 24 before connecting to it by matching the amplitude and phase of $V_{OUT}$ to that of $V_{GRID}$. FIG. 8 illustrates exemplary elements of the one or more additional processing and system control circuits 18 that provide mode control, mains frequency/phase locking, synchronization and contactor control. It should be understood that the illustrated circuits can be implemented in whole or in part in a DSP or other digital processing logic and can be integrated with the signal processing logic of regulator circuit 16.

The one or more additional processing and system control circuits include, but are not necessarily limited to, a timing/mode control circuit 130, a voltage control circuit 132, a sync detection circuit 134, and a contactor control circuit 136. In operation, the timing/mode control circuit 130 provides mode control (e.g., Stand Alone mode, Synchronization mode, Grid Parallel mode, Stop mode, and Idle mode) based on default mode selection, user inputs, and/or based on monitoring relevant signals, such as whether the grid is present and operating within nominal parameters, etc.

Timing/mode control circuit 130 further provides the $REF_X$ and $REF_Y$ signals discussed earlier herein. When operating in Stand Alone mode, the $REF_X$ and $REF_Y$ signals are digital sinusoids referenced to desired stand-alone voltage magnitude, phase, and frequency. When operating in Synchronization or Grid Parallel modes, the $REF_X$ and $REF_Y$ signals are referenced to the ac mains voltage of grid 24.

In operation, voltage control circuit 132 generates the $V_{REF}$ signal that is used to control PWM switching controller 50 (see FIG. 2A) during Synchronization and Stand Alone modes of operation. In the Stand Alone mode of operation, timing/mode control circuit 130 uses stored values or other defined constants to represent the desired x and y components of the inverter's output voltage, denoted as $V_{XDESIRED}$ and $V_{YDESIRED}$, respectively. Differencing circuits 140-1 and 140-2 thus generate fundamental component error signals $V_{XERR}$ and $V_{YERR}$ based on the difference (error) between the desired fundamental components of inverter output voltage and the measured x and y fundamental components of its actual output voltage (denoted as $V_{XOUT}$ and $V_{YOUT}$).

During Synchronization mode, voltage control circuit 132 controls its output $V_{REF}$ based on the error between the inverter's measured output voltage ($V_{XYOUT}$), and the grid's measured voltage ($V_{XYGRID}$). That is, $V_{XGRID}$ is substituted for $V_{XDESIRED}$ and $V_{YGRID}$ is substituted for $V_{YDESIRED}$. Thus, when inverter 10 is to be connected to grid 24, it synchronizes its output voltage to the grid based on matching the fundamental components of its output voltage to the corresponding fundamental (x-y) components of the grid voltage. This approach effectively ignores harmonic differences in grid and inverter voltages that might otherwise disturb control stability or cause matching errors.

As an overview of operation, the difference between $V_{XGRID}$ and $V_{XOUT}$ and between $V_{YGRID}$ and $V_{YOUT}$ represent the fundamental error voltage components. During Synchronization mode operation, voltage control circuit 132 adjusts its $V_{REF}$ output to control switching controller 50 (via switch 51 in FIG. 2A) such that $V_{OUT}$ changes to reduce the error. Once inverter 10 is synchronized and contactor closure is verified, switch 51 can be switched over such that switching controller 50 is driven by regulator circuit 16 in its current/power regulation operation rather than by the output voltage regulation provided by voltage control circuit 132. Of course, it should be understood that this control switching scheme can be implemented in software such that control switchover simply means executing different portions of the inverter control program.

Figure 9:
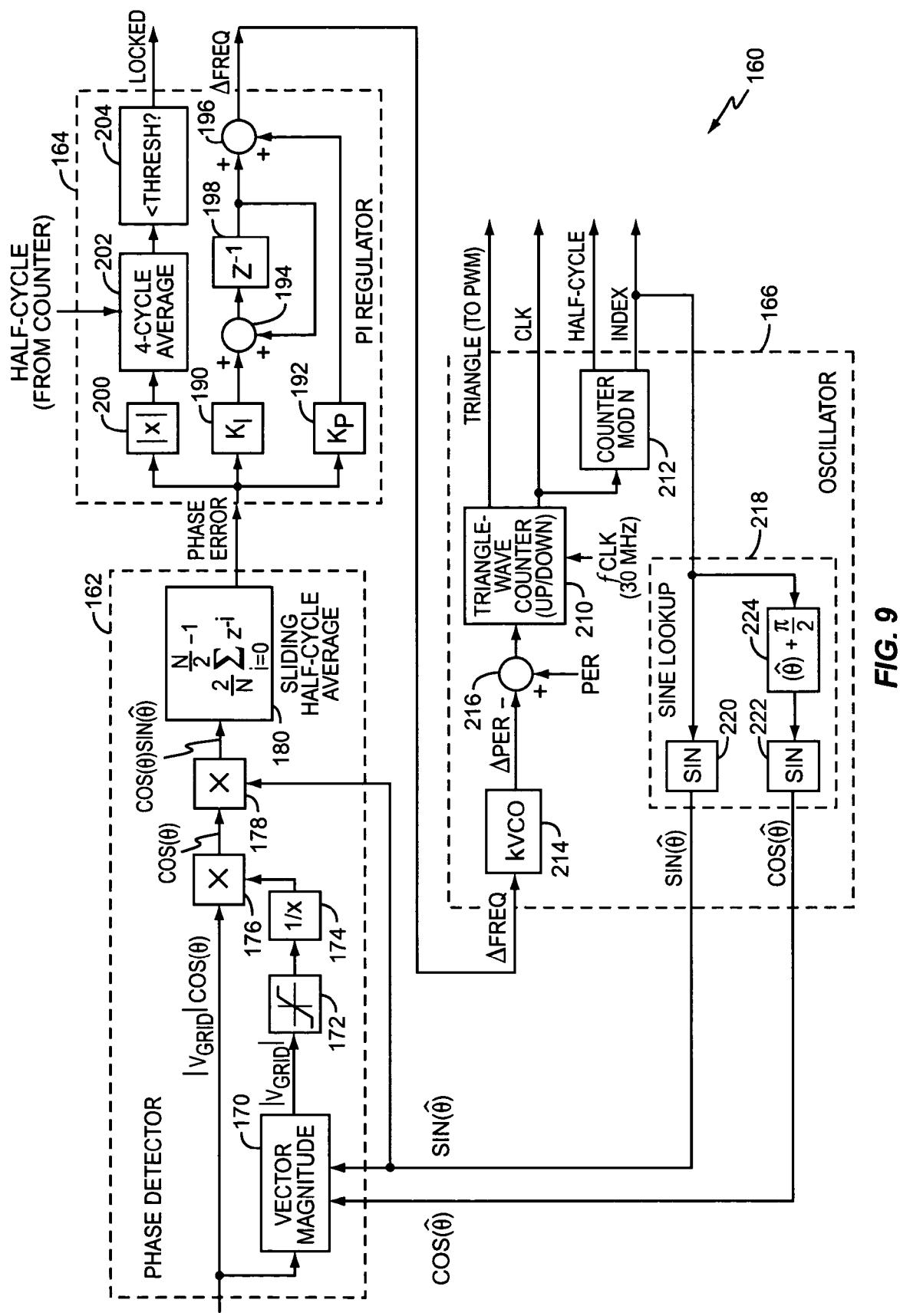
FIG. 9 is a diagram of an exemplary PLL circuit according to one or more embodiments of the present invention.

Establishing and maintaining synchronization with grid 24 requires inverter 10 to detect and lock to the frequency and phase the grid voltage. In an exemplary embodiment, timing/mode control circuit 130 includes a PLL circuit configured according to one or more embodiments of the present invention. Although referred to briefly earlier herein, an exemplary PLL circuit 160 is illustrated in FIG. 9 and described in detail below.

PLL circuit 160 comprises a phase detector 162, a filter circuit 164—e.g., a PI regulator circuit—and an oscillator circuit 166. The illustrated circuits can be implemented in hardware, in software, or in some combination thereof. For example, in one or more embodiments, PLL circuit 160 is implemented as a computer program stored in memory for execution by a TMS320C24x DSP from TEXAS INSTRUMENTS or by some other DSP or microprocessor. In such embodiments, the PLL circuit 160 makes advantageous use of counter/timers, ADCs, etc., integrated with the processor such that the PLL circuit 160 and, indeed, the overall control circuit 14 can be implemented largely in a single DSP or other digital processing device.

Regardless, the exemplary PLL circuit 160 enables inverter 10 to lock to the frequency and phase of the ac voltage waveform of grid 24—i.e., to lock with a signal of interest and maintain phase/frequency synchronization with that signal. More broadly, the PLL circuit 160 provides sinusoidal signals in phase and in quadrature with the grid voltage—i.e., it uses the grid voltage to establish the reference frame for the $REF_X$ and $REF_Y$ signals when inverter 10 is not operating in Stand Alone mode. Further, the PLL circuit 160 provides timing signals for the PWM operations of inverter 10 (see PWM controller 50 of FIG. 2A), and provides timing signals for the above described inverter control algorithms. For example, the k, k+1, k+2, etc., control law time steps illustrated in FIGS. 4A and 4B can be established by the exemplary PLL circuit 160. In one embodiment, the oscillator circuit 166 is configured to output an underlying timing control signal at 128 times the PLL output signal period. That is, PLL circuit 160 establishes a control timing signal that provides 128 time steps per waveform period.

In looking at the individual functional blocks of PLL circuit 160 in more detail, one sees that the exemplary phase detector 162 comprises a vector magnitude calculator 170, a limiter 172, an inverter (1/x) 174, multipliers 176 and 178, and an averaging circuit 180. Broadly, the phase detector 162 generates a phase error signal based on the phase difference between the PLL's output signal and the input signal, which is a sampled signal obtained from measuring the grid's ac voltage waveform. More particularly, the phase difference between the input and PLL sinuosoids is computed by taking their product and filtering out the ac components. The input signal to the PLL circuit 160 is the ac line voltage of grid 24, which may be expressed as, $$v(t) = |V_{GRID}| \cos(\theta) \quad (7)$$

where $\theta = \omega t$ is the instantaneous phase angle of the ac line voltage. The PLL output signal can be expressed as, $$y(t) = \sin(\hat{\theta}), \quad (8)$$

where $\hat{\theta} = \omega t + \phi$ is the instantaneous phase angle of the PLL signal, and $\phi$ is the instantaneous phase error of the PLL. Thus, the product of the input signal and PLL output signal obtained from multipliers 176 and 178 is, $$p(t) = |V_{GRID}| \cos(\theta) \sin(\hat{\theta}) = \frac{1}{2} |V_{GRID}| (\sin(\theta + \hat{\theta}) - \sin(\theta - \hat{\theta})). \quad (9)$$

The above expression for p(t) can be rewritten by substitution as, $$p(t) = \frac{1}{2} |V_{GRID}| (\sin(2\omega t - \phi) + \sin(\phi)). \quad (10)$$

As such, the product signal obtained from multiplier 178 is now seen to contain a double-frequency term and a substantially dc term equal to the sine of the PLL phase error. Averaging circuit 180 can be configured to a 64-point (half-cycle) moving average of the product signal—assuming that the PLL circuit 160 operates at time steps of 1/128th of the fundamental waveform period. In the case where the input signal and the PLL output signal are of the same frequency, averaging circuit 180 eliminates the ac term and yields a dc phase error signal that is proportional to the sine of the phase error, which is approximately equal to the phase error for small values of angle.

Further, in the above expressions it can be seen that the magnitude of the input signal, e.g., the magnitude of the grid voltage, appears as a coefficient multiplying the phase error. Thus, the PLL circuit advantageously provides normalization of the input signal to obtain consistent PLL performance over a wide range of input signal amplitudes. In an exemplary embodiment, normalization is based on one or more fundamental components of the input signal but it should be understood that other normalizing quantities can be used, such as the average rectified value of the input signal. For the exemplary normalization based on the fundamental components of the input signal, vector magnitude calculator 170 can be used to determine the fundamental in-phase (x) phasor component of the grid voltage using the PLL output signal as the reference sinuosoids for its computations. Fundamental component calculations in this context can be the same as those described in detail earlier herein. The input signal then can be normalized according to its fundamental component value by multiplying it with the inverse of the fundamental component using inverse circuit 174 and multiplier 176.

The resultant phase error signal serves as an input to the loop filter circuit 164, which, as noted, is implemented as a Pi regulator circuit in an exemplary embodiment and comprises an integral term gain block 190, a proportional term gain block 192, first and second summing circuits 194 and 196, a delay circuit 198, an absolute value circuit 200, an averaging circuit 202, and a threshold comparison circuit 204. The forward loop transfer function provided by filter circuit 164 calculates a frequency correction signal as a function of the phase error signal generated by phase detector circuit 162. The PI regulation provided by filter circuit 164 can be implemented in firmware, software, etc., and can be based on default or configurable proportional and integral gain terms. In an exemplary embodiment, the PI gain terms $K_I$ and $K_P$ were determined empirically based on measurements obtained from exemplary ac electrical systems but it should be understood that PLL circuit 160 can be configured such that these and other configured values can be reconfigured in-system as needed.

In any case, gain blocks 190 and 192, along with summers 194 and 196 and delay block 198, are used to generate proportional and integral gain terms that are summed to produce the frequency correction signal used to drive the oscillator circuit 166. However, the exemplary filter circuit 164 provides additional functionality by detecting when the PLL circuit 160 is locked to the input signal. For this function, circuit 200 provides the absolute value of the phase error signal to averaging circuit 202, which is configured to maintain a moving average of the absolute value of the phase error between the input signal and PLL output signal over a desired number of waveform periods. In an exemplary embodiment, averaging circuit 202 averages over four cycles of the waveform period of interest, e.g., 60 Hz. Note that oscillator circuit 166 can be configured to provide a half-cycle output signal as one of its exemplary control timing output signals, and the averaging circuit 202 can use this signal to time its averaging operations.

The averaged phase error generated by averaging circuit 202 serves as an input to threshold comparator circuit 204, which is configured to compare the average phase error to a configurable threshold value. The average phase error falling below this threshold value indicates a locked condition and, thus, threshold comparator circuit 204 asserts its LOCKED output signal responsive to determining that the average phase error has fallen below the threshold. As described earlier herein, the LOCKED signal then can be used to trigger further synchronization operations associated with interconnecting inverter 10 to grid 24. Those skilled in the art will appreciate that the threshold for determining the locked condition can be maintained memory as a stored parameter, and thus can represent an empirically determined value that allows for expected levels of noise, etc. in the measurement and digitization of the relevant system signals. As with other stored values, the PLL circuit 160 can be configured such that the locked threshold value can be updated in-system or tuned over time.

Turning to the exemplary oscillator circuit 166, one sees that it comprises a first timer/counter 210, a second timer/counter 212, an input gain block 214, a summing circuit 216, and an output circuit 218 comprising sine lookup circuits 220 and 222, and a phase shifting circuit 224—i.e., a 90° phase shift. Circuit 220 outputs sine values and, with the phase shift, circuit 222 outputs corresponding cosine values. With this arrangement, output circuit 218 can be configured as a table lookup circuit that clocks through a table of stored sinusoidal values and thus generates the PLL output signal as a sine/cosine pair of digital sinusoids having a waveform period determined by the table lookup clocking rate, i.e., the sample output rate. These digital sinusoids can serve as the $REF_X$ and $REF_Y$ signals used elsewhere in the inverter 10 as described earlier herein and, by operation of the PLL circuit 160 (when not in Stand Alone mode), are generated as in-phase and quadrature signals relative to the ac voltage waveform of grid 24.

Establishing the frequency of the PLL output signals comprises setting the period of counter/timer 210 based on a defined counter clocking frequency of, for example, 30 MHz, and a known number of entries in the sinusoidal lookup table used by output circuit 218, which is 128 entries in an exemplary embodiment. The counter/timer parameter that establishes this period can be configured such that the oscillator circuit 166 has a nominal output frequency of 60 Hz, or some other desired nominal value.

With that approach, the phase error signal from filter circuit 164 serves as a control input that shifts the nominal frequency of the oscillator circuit 166 as needed to minimize the phase error between the PLL output signal and the input signal of interest. This operation can be understood better by looking at the input gain block 214, which receives the phase error signal as its input and provides a corresponding output signal, ΔPER, which represents the value of the phase error signal (sample) multiplied by the gain term $K_{VCO}$. Therefore, where the value PER corresponds to the desired nominal period of the PLL output signal, summing circuit 216 generates an adjusted period value as (PER−ΔPER). That adjusted period value is provided to counter/timer 210 and thus shifts the frequency of the PLL output signal as needed to minimize phase/frequency errors. Complementing this arrangement, counter/timer 212, which is a MOD-N counter, provides the corresponding table lookup clocking signal at 128 times the PLL frequency (or at some other desired multiple), such that output circuit 218 clocks out 128 sine/cosine sample pairs per PLL period.

Among its many advantages, this digital implementation of PLL circuit 160 enables straightforward and robust switching between Grid Parallel and Stand Alone modes of inverter operation. That is, PLL circuit 160 is configured to have a desired nominal phase/frequency that is adjusted as needed to lock with the voltage of grid 24 when it is desired to operate inverter 10 in synchronization with grid 24. However, such adjustments can be overridden or otherwise ignored when it is desired to operate inverter 10 in its Stand Alone mode, wherein the PLL circuit 160 generates its output signal based on the desired nominal frequency at an arbitrary signal phase.

One exemplary method for running PLL circuit 160 in Stand Alone mode comprises nulling or otherwise zeroing the frequency correction signal or, more directly, zeroing the ΔPER signal, such that counter/timer 210 runs according to the nominal PER value. PLL circuit 160 can be configured to zero the frequency correction signal irrespective of whether phase detector 162 still receives the grid voltage as an input signal, but an exemplary embodiment simplifies the override function by zeroing the $K_{VCO}$ gain term of gain block 214 such that the ΔPER value is zero irrespective of whether the frequency correction signal is zeroed.

Figure 10:
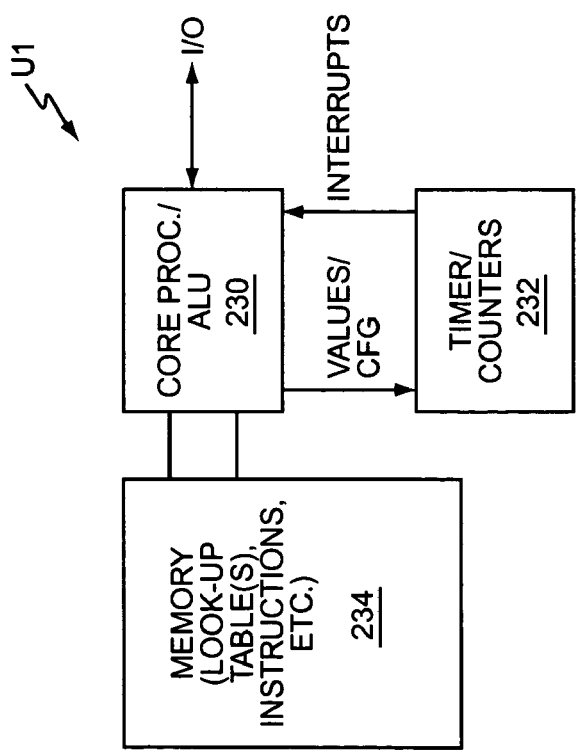
FIG. 10 is a diagram of an exemplary digital processor-based implementation of the PLL circuit of FIG. 9.

Of course, with its exemplary digital implementation, the above details for PLL circuit 160 are subject to variation in terms of their specific implementations. FIG. 10 illustrates the flexibility of integrating exemplary PLL circuit functionality into a DSP or other digital processor, wherein the program instructions, memory, and much of the supporting timing circuits, all are integrated into an Integrated Circuit (IC) device U1, which can be a TMS320C240 DSP as noted earlier. Indeed, the earlier illustrated digitization circuits used to measure the relevant system signals, e.g., grid voltage, etc., denoted as U2 in FIG. 2B can be integrated with U1.

In any case, the PLL circuit 160 is embodied as firmware, software, etc., preferably stored in memory 234 for access and execution by a core processor 230. The timing functions described above can be carried out using integrated timer/counters 232, which can be configured by core processor 230 with the appropriate configuration values, and can provide core processor 230 with interrupt or other timed signals useful in driving the deterministic control timing of inverter 10.

Figure 11:
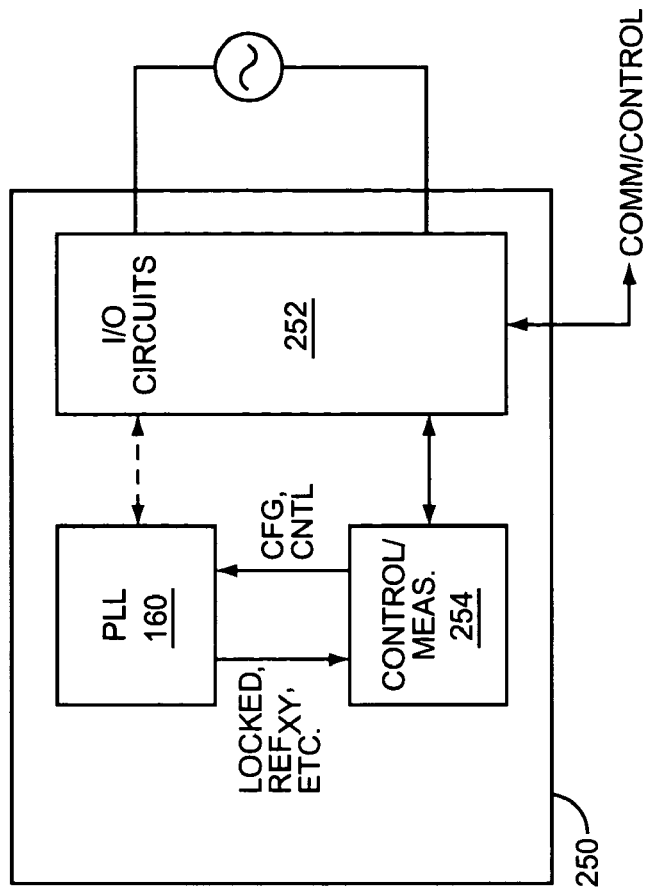
FIG. 11 is a diagram of an exemplary ac measurement device incorporating the PLL circuit of FIG. 9.

With this flexibility, it should be understood that PLL circuit 160 is not limited to its exemplary use in inverter 10 and, indeed, it can be implanted in a wide variety of devices, including ac power measurement/monitoring devices, such as the device 250 illustrated in FIG. 11. In broad terms, device 250 comprises Input/Output (I/O) circuits 252 to interface with an external electrical system (e.g., grid 24) and other control or supervisory systems as needed (not shown). Device 250 further comprises the PLL circuit 160 according to one or more embodiments of the present invention, and a corresponding measurement/control circuit 254, which is configured according to the intended function of device 250. For example, device 250 might be configured as an electronic power meter, in which case the measurement/control circuit 254 would use PLL circuit 160 to synchronize its measurement operations with respect to the external electrical system.

The present invention thus provides a flexible and robust PLL circuit 160 that can be used in a wide variety of ac devices, including, but not limited to, ac power inverters, ac power meters, etc. Preferably, the PLL circuit 160 is implemented as a digital PLL that can be integrated with other digital processes and thus can be realized as firmware or other computer code for execution by the device's microprocessor resources. Broadly, then, the present invention provides an exemplary PLL circuit apparatus and method and, as such, is not limited by the foregoing details. Indeed, the present invention is limited only by the following claims and their reasonable equivalents.

What is claimed is:

1. A computer readable medium storing a computer program to implement a Phase-Locked Loop (PLL), the computer program comprising:
   program instructions to generate a product signal by multiplying an input signal of interest representing an in-phase fundamental component of an ac voltage waveform with a PLL output signal to be locked with the input signal;
   program instructions to generate a substantially dc phase error signal by averaging the product signal over half-cycles of a waveform period of interest;
   program instructions to generate a frequency correction signal based on proportional-integral processing of the substantially dc phase error signal; and
   program instructions to generate the PLL output signal by clocking through a waveform lookup table at a desired clock rate determined by configuring a digital counter to generate a periodic clock signal at a period determined by a configuration value, and to adjust that clock rate as a function of the substantially dc phase error signal by adjusting the period as a function of the frequency correction signal to output successive sine and cosine values from a stored data table.

2. The computer readable medium of claim 1, wherein the computer program further comprises program instructions to normalize the product signal as a function of a magnitude of the input signal.

3. The computer readable medium of claim 2, wherein the program instructions to normalize the product signal as a function of a magnitude of the input signal comprise program instructions to normalize the input signal based on one or more fundamental components determined for the input signal.

4. The computer readable medium of claim 3, further comprising program instructions to compute the one or more fundamental components for the input signal.

5. The computer readable medium of claim 4, wherein the program instructions to compute the one or more fundamental components for the input signal comprises program instructions to compute x-y phasor components for the input signal.

6. The computer readable medium of claim 1, wherein the program instructions to generate the PLL output signal by clocking through a waveform lookup table at a desired clock rate, and to adjust that clock rate as a function of the phase en-or signal comprises program instructions to generate the PLL output signal as a first sinusoid output signal that is in-phase with the input signal of interest, and a second sinusoid output signal that is in quadrature with input signal of interest.

7. The computer readable medium of claim 1, wherein the input signal of interest comprises a sampled signal corresponding to an ac voltage waveform such that the PLL locks to a phase and frequency of the at voltage waveform.

8. A Phase-Locked Loop (PLL) circuit comprising:
a phase detector circuit including a multiplier to generate a product signal by multiplying an input signal of interest with a PLL output signal to be locked with the input signal, and a normalizer circuit to normalize the product signal as a function of a magnitude of the input signal of interest, the normalizer circuit having a vector magnitude calculator to compute one or more fundamental components of the input signal of interest, and a scaler circuit to normalize the product signal using the one or more fundamental components of the input signal of interest, the phase detector circuit configured to generate a phase error signal by averaging the product signal over half-cycles of a waveform period of interest;
a loop filter circuit to generate a frequency correction signal by filtering the phase error signal; and
an oscillator circuit comprising a counter circuit configured to generate the PLL output signal by clocking through a waveform lookup table at a desired clock output signal rate, and wherein the counter circuit is configured to adjust that clock output signal rate as a function of the phase error signal.

9. The PLL circuit of claim 8, wherein the phase detector, loop filter, and oscillator circuits comprise digital circuits implemented in a digital processor.

10. The PLL circuit of claim 8, wherein the oscillator circuit comprises a periodic signal generator that generates the PLL output signal as in-phase and quadrature sinusoids.

11. The PLL circuit of claim 10, wherein the vector magnitude circuit is configured to use the PLL output signal as a reference for computing the fundamental components of the input signal.

12. The PLL circuit of claim 8, wherein the phase detector circuit comprises a digital phase detector that includes a digital filter circuit to generate the phase error signal based on performing a sliding half-cycle averaging of the product signal.

13. The PLL circuit of claim 8, wherein the input signal comprises a single-phase ac waveform.

14. The PLL circuit of claim 8, further comprising a lock detection circuit that generates a locked signal to indicate a locked condition of the PLL circuit based on averaging a magnitude of the frequency correction signal over a desired number of waveform periods.

15. The PLL circuit of claim 8, wherein the oscillator circuit is configured to override the frequency correction signal in a standalone mode such that an output frequency of the PLL output signal is set by a nominal output signal period.

16. The PLL circuit of claim 8, wherein the input signal comprises an in-phase component of an ac voltage waveform of interest, and wherein the phase detector circuit is configured to generate die product signal by multiplying die input signal with a quadrature component of the PLL output signal.

17. A method of locking an output signal to a frequency and phase of an input signal of interest using a digital processor, the method comprising:
generating a PLL output signal to be locked with a frequency and phase of a periodic input signal of interest, a digitized voltage waveform obtained from an ac voltage signal, by running a digital counter circuit at a known clock rate, setting a cycle count of the digital counter circuit to a nominal value corresponding to a nominal period;
multiplying the input signal of interest by die PLL output signal to generate a product signal and filtering the product signal over a desired number of half-cycles to generate a substantially dc phase error term;
calculating a frequency correction signal, as a delta count value, from the substantially dc phase error term, and increasing or decreasing the cycle count by applying the delta count value to the cycle count such that the nominal period is adjusted as a function of the frequency correction signal;
outputting table lookup values corresponding to a desired output waveform at a rate determined as a function of the frequency correction signal; and
adjusting a frequency of the PLL output signal responsive to the frequency correction signal to lock the output signal to the input signal.

18. The method of claim 17, further comprising operating in a standalone mode by overriding the frequency correction signal such that die cycle count is a function of the nominal clock period.

19. The method of claim 17, wherein outputting table lookup values corresponding to a desired output waveform at a rate determined as a function of the frequency correction signal comprises outputting in-phase table values as a first PLL output signal, and outputting quadrature table values as a second PLL output signal.

20. The method of claim 17, further comprising detecting a locked condition of die PLL output signal based on averaging a magnitude of the frequency correction signal over a desired number of waveform periods.

21. The method of claim 17, further comprising overriding the frequency correction signal for operation in a standalone mode, wherein an output frequency of the PLL output signal is set by a nominal output signal period.

22. The method of claim 17, wherein the periodic input signal of interest comprises a sampled signal corresponding to a single-phase ac waveform.

* * * * *